US010304812B2

(12) United States Patent
Mercier et al.

(10) Patent No.: US 10,304,812 B2
(45) Date of Patent: May 28, 2019

(54) OPTOELECTRONIC DEVICE INCLUDING LIGHT-EMITTING DIODES AND A CONTROL CIRCUIT

(71) Applicant: Aledia, Grenoble (FR)

(72) Inventors: Frédéric Mercier, Saint Nicolas de Macherin (FR); Philipe Gilet, Teche (FR); Xavier Hugon, Teche (FR)

(73) Assignee: Aledia, Grenoble (FR)

( * ) Notice: Subject to any disclaimer, the term of this patent is extended or adjusted under 35 U.S.C. 154(b) by 153 days.

(21) Appl. No.: 15/321,798

(22) PCT Filed: Jun. 30, 2015

(86) PCT No.: PCT/EP2015/064798
§ 371 (c)(1),
(2) Date: Dec. 23, 2016

(87) PCT Pub. No.: WO2016/001200
PCT Pub. Date: Jan. 7, 2016

(65) Prior Publication Data
US 2017/0133356 A1 May 11, 2017

(30) Foreign Application Priority Data
Jun. 30, 2014 (FR) ..................................... 14 56178

(51) Int. Cl.
*H01L 25/16* (2006.01)
*H01L 27/15* (2006.01)
(Continued)

(52) U.S. Cl.
CPC .......... *H01L 25/167* (2013.01); *H01L 27/153* (2013.01); *H01L 33/08* (2013.01);
(Continued)

(58) Field of Classification Search
CPC .................... H01L 25/167; H01L 2224/16145
See application file for complete search history.

(56) References Cited

U.S. PATENT DOCUMENTS 8,241,932 B1 * 8/2012 Yu ....................... H01L 25/0753
257/E21.122
8,624,968 B1 1/2014 Hersee et al.
(Continued)

FOREIGN PATENT DOCUMENTS

CN 103378109 A 10/2013
CN 103811356 A 5/2014
(Continued)

OTHER PUBLICATIONS

International Search Report for Application No. PCT/EP2015/064798 dated Aug. 14, 2015.
(Continued)

*Primary Examiner* — Stephen W Smoot
*Assistant Examiner* — Sun Mi Kim King
(74) *Attorney, Agent, or Firm* — Wolf, Greenfield & Sacks, P.C.

(57) ABSTRACT

An optoelectronic device including a first integrated circuit that includes:—a substrate, having first and second opposite surfaces; and—groups of sets of light-emitting diodes resting on the first surface. The integrated circuit also includes:—in the substrate, first side elements for electrically insulating portions of the substrate around each set; and—for each group on the second surface, at least one first conductive contact, connected to the first terminal of the group, and one second conductive contact, connected to the second terminal of the group. The device includes a second integrated circuit containing:—third and fourth opposite surfaces; and—third conductive contacts, located on the third surface and electrically connected to the first and second conductive contacts. The first integrated circuit is
(Continued)

attached onto the third surface of the second integrated circuit.

9 Claims, 5 Drawing Sheets

(51) Int. Cl.
H01L 33/08 (2010.01)
H01L 33/18 (2010.01)
H01L 33/24 (2010.01)
H05B 33/08 (2006.01)
H01L 33/20 (2010.01)
H01L 33/38 (2010.01)
H01L 33/44 (2010.01)
H01L 33/62 (2010.01)

(52) U.S. Cl.
CPC .............. *H01L 33/18* (2013.01); *H01L 33/24* (2013.01); *H05B 33/083* (2013.01); *H01L 33/20* (2013.01); *H01L 33/385* (2013.01); *H01L 33/44* (2013.01); *H01L 33/62* (2013.01); *H01L 2224/16145* (2013.01); *H01L 2224/48091* (2013.01); *H01L 2224/73257* (2013.01)

(56) References Cited

U.S. PATENT DOCUMENTS

| | | | |
|---|---|---|---|
| 2003/0013217 | A1 | 1/2003 | Dudoff et al. |
| 2011/0126891 | A1 | 6/2011 | Goto et al. |
| 2011/0254034 | A1* | 10/2011 | Konsek ................. B82Y 20/00 257/98 |
| 2012/0193785 | A1* | 8/2012 | Lin .................. H01L 21/76229 257/737 |
| 2013/0285180 | A1* | 10/2013 | Wang ................ H01L 27/14618 257/432 |
| 2014/0077151 | A1 | 3/2014 | Pougeoise et al. |
| 2014/0133105 | A1* | 5/2014 | Yee ................... H05K 7/20509 361/720 |

FOREIGN PATENT DOCUMENTS

EP 2 357 676 A1 8/2011
EP 2 665 100 A2 11/2013

OTHER PUBLICATIONS

Wang et al., Color-tunable, phosphor-free InGaN nanowire light-emitting diode arrays monolithically integrated on silicon. Optics Express. 2014; 22(S7): A1768-A1775.
English translation of Chinese Office Communication for Application No. CN 201580036246.7 dated Jan. 23, 2018.
Written Opinion of the International Searching Authority for Application No. PCT/EP2015/064798 dated Jan. 3, 2017.

* cited by examiner

OPTOELECTRONIC DEVICE INCLUDING LIGHT-EMITTING DIODES AND A CONTROL CIRCUIT

CROSS REFERENCE TO RELATED APPLICATIONS

This application is the national phase of International Application No. PCT/EP2015/064798, filed on Jun. 30, 2015, which claims priority to French Application No. 14/56178, filed on Jun. 30, 2014, which applications are hereby incorporated by reference to the maximum extent allowable by law.

BACKGROUND

The present invention generally relates to optoelectronic devices based on semiconductor materials and to methods of manufacturing the same. The present invention more specifically relates to optoelectronic devices comprising light-emitting diodes formed by three-dimensional elements, particularly semiconductor microwires or nanowires.

DISCUSSION OF THE RELATED ART

Phrase "optoelectronic devices comprising light-emitting diodes" designates devices capable of converting an electric signal into an electromagnetic radiation, and particularly devices dedicated to emitting an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter.

An optoelectronic device may comprise a plurality of light-emitting diodes and a light-emitting diode control circuit. As an example, it may be desirable to power the optoelectronic device with an AC voltage, particularly the mains voltage. The light-emitting diode control circuit may then be capable of rectifying the AC voltage and of selectively powering the light-emitting diodes to adapt to the instantaneous voltage across the device and, for example, contribute to decreasing phenomena of flickering of the light emitted by the light-emitting diodes. Document WO 2013/110029 describes an optoelectronic device of this type. The light-emitting diodes correspond to discrete optoelectronic components, which may each comprise one or a plurality of light-emitting diodes. The control circuit may correspond to an integrated circuit having the optoelectronic components connected thereto.

A disadvantage is that the number of light-emitting diodes connected to the integrated circuit is limited by the bulk of the optoelectronic components and the minimum distance to be maintained between the optoelectronic components. Further, the method of manufacturing the optoelectronic device may be complex since it comprises steps of connection of each optoelectronic component to the control circuit.

SUMMARY

Thus, an object of an embodiment is to overcome at least part of the disadvantages of previously-described optoelectronic devices comprising light-emitting diodes and of their manufacturing methods.

Another object of an embodiment is to increase the compactness of the optoelectronic device by decreasing the space occupied by the light-emitting diodes.

Another object of an embodiment is to decrease the bulk of the optoelectronic device comprising series-connected light-emitting diodes.

Another object of an embodiment is to decrease the number of steps of the method of manufacturing an optoelectronic device.

Another object of an embodiment is for optoelectronic devices comprising light-emitting diodes to be capable of being manufactured at an industrial scale and at a low cost.

Thus, an embodiment provides an optoelectronic device comprising:

a first integrated circuit comprising a support comprising first and second opposite surfaces, groups of assemblies of light-emitting diodes resting on the first surface, each group comprising at least one assembly of light-emitting diodes connected in parallel and/or in series between first and second terminals, and each assembly of light-emitting diodes comprising a wire, conical or frustoconical semiconductor element or a plurality of wire, conical or frustoconical semiconductor elements connected in parallel, the first integrated circuit further comprising, in the support, first elements of lateral electric insulation of portions of the support around each assembly and, on the second surface, for each group, at least one first conductive pad connected to the first terminal of the group and a second conductive pad connected to the second terminal of the group; and a second integrated circuit comprising third and fourth opposite surfaces, third conductive pads on the third surface electrically connected to the first and second conductive pads, the first integrated circuit being fixed to the third surface of the second integrated circuit.

According to an embodiment, the support comprises a substrate comprising fifth and sixth opposite surfaces, the light-emitting diodes being located on the side of the fifth surface and comprising, for each assembly, at least one second conductive element insulated from the substrate and crossing the substrate from the fifth substrate to the sixth surface and connected to one of the first conductive pads.

According to an embodiment, the first elements are capable of laterally electrically insulating portions of the substrate underlying the light-emitting diodes of each assembly.

According to an embodiment, the first elements comprise insulating walls extending in the substrate from the fifth surface to the sixth surface.

According to an embodiment, the second integrated circuit comprises thermal drains crossing the second integrated circuit from the third surface to the fourth surface.

According to an embodiment, the device comprises, for each assembly, an electrode layer covering each light-emitting diode of said assembly and further comprises a conductive layer covering the electrode layer around the light-emitting diodes of said assembly.

According to an embodiment, the second element is in contact with the conductive layer or the electrode layer.

According to an embodiment, the second integrated circuit comprises a rectifying circuit intended to receive an AC voltage.

According to an embodiment, the first integrated circuit comprises N groups of assemblies of light-emitting diodes, where N is an integer varying from 2 to 200, and the second integrated circuit comprises N−1 switch, each switch being connected to the first terminal or the second terminal of one of said groups.

According to an embodiment, the second integrated circuit comprises N current sources, each of N−1 of said current sources being connected to the first or second terminals of one of said groups.

According to an embodiment, the device comprises fourth conductive pads on the fourth surface.

According to an embodiment, at least one of the groups comprises at least two assemblies of light-emitting diodes.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
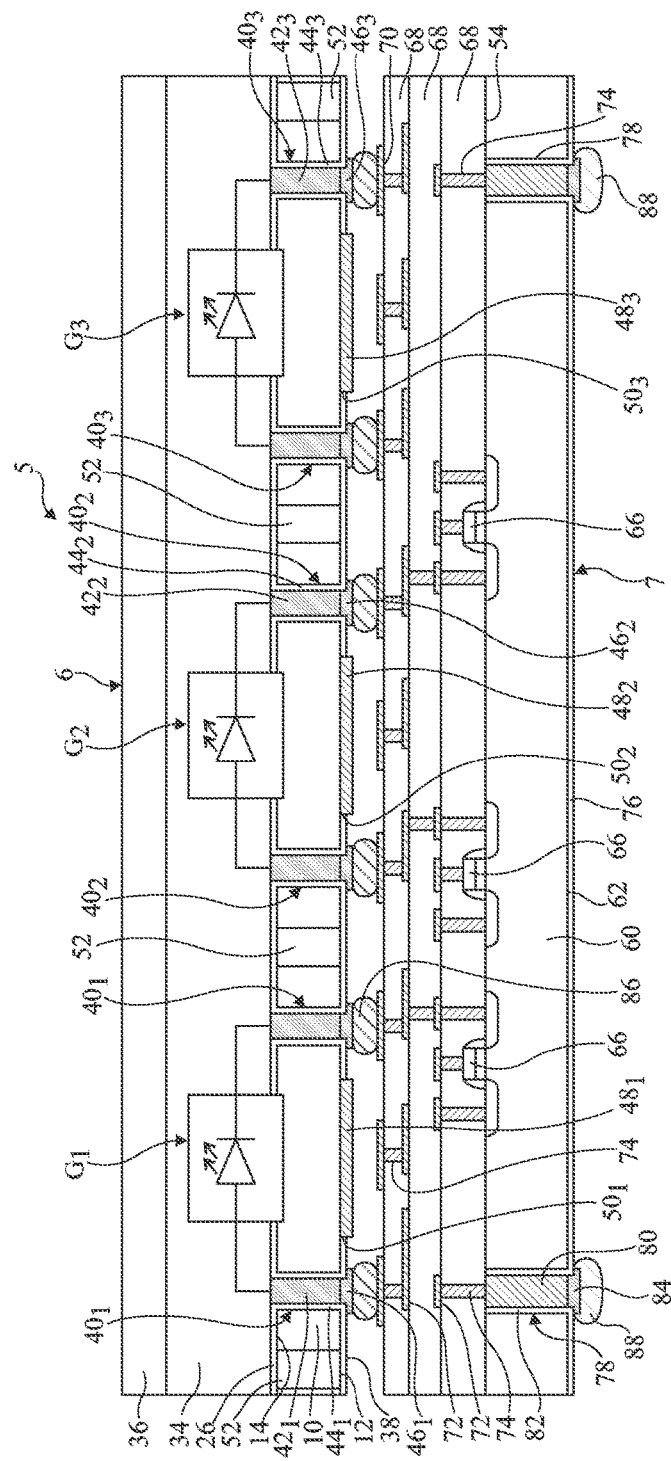
FIG. 1 is a partial simplified cross-section view of an embodiment of an optoelectronic device comprising light-emitting diodes.

For clarity, the same elements have been designated with the same reference numerals in the various drawings and, further, as usual in the representation of integrated circuits, the various drawings are not to scale. Further, only those elements which are useful to the understanding of the present description have been shown and will be described. In particular, the logic circuits of the circuit for controlling the optoelectronic device described hereafter are within the abilities of those skilled in the art and are not described in detail.

In the following description, unless otherwise indicated, terms "substantially", "approximately", and "in the order of" mean "to within 10%". Further, "compound mainly made of a material" or "compound based on a material" means that a compound comprises a proportion greater than or equal to 95% of said material, this proportion being preferably greater than 99%.

The present description relates to optoelectronic devices comprising light-emitting diodes formed from three-dimensional elements, for example, microwires, nanowires, conical elements, or frustoconical elements. In the following description, embodiments are described for light-emitting diodes formed from microwires or nanowires. However, these embodiments may be implemented for three-dimensional elements other than microwires or nanowires, for example, pyramid-shaped three-dimensional elements.

Term "microwire" or "nanowire" designates a three-dimensional structure having an elongated shape along a preferred direction, having at least two dimensions, called minor dimensions, in the range from 5 nm to 2.5 μm, preferably from 50 nm to 2.5 μm, the third dimension, called major dimension, being at least equal to 1 time, preferably at least 5 times, and more preferably still at least 10 times, the largest minor dimension. In certain embodiments, the minor dimensions may be smaller than or equal to approximately 1 μm, preferably in the range from 100 nm to 1 μm, more preferably from 100 nm to 300 nm. In certain embodiments, the height of each microwire or nanowire may be greater than or equal to 500 nm, preferably in the range from 1 μm to 50 μm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

According to an embodiment, an optoelectronic device comprising at least two integrated circuits, also called chips, is provided. The first integrated circuit comprises at least two assemblies of light-emitting diodes formed on the front surface of a semiconductor substrate and electrically insulated from each other. Through silicon vias or TSVs are formed in the semiconductor substrate and insulated therefrom, each TSV connecting the front surface of the substrate to the rear surface. The second integrated circuit comprises electronic components, particularly transistors, used for the control of the assemblies of light-emitting diodes of the first integrated circuit. The first integrated circuit is fixed to the second integrated circuit, for example, by a "flip-chip"-type connection. The solder bumps which connected the optoelectronic chip to the control chip ensure the mechanical connection between the optoelectronic chip and the control chip and further ensure the electric connection of each assembly of light-emitting diodes to the control chip. The first integrated circuit is called optoelectronic circuit or optoelectronic chip in the following description and the second integrated circuit is called control circuit or control chip in the following description.

The optoelectronic chip and the control chip being stacked, the lateral bulk of the device is decreased. As an example, the optoelectronic device occupies in top view a surface area in the range from 1 mm$^2$ to a few square centimeters. Further, the optoelectronic chip may have the same dimensions as the control chip. Thereby, the compactness of the optoelectronic device can advantageously be increased.

Preferably, the optoelectronic chip only comprises light-emitting diodes and elements of connection of these light-emitting diodes and the control chip comprises all the electronic components necessary to control the light-emitting diodes of the optoelectronic chip. As a variation, the optoelectronic chip may also comprise other electronic components in addition to the light-emitting diodes.

The assembly comprising the optoelectronic chip fixed to the control chip may be arranged in a protection package. The protection package may be fixed to a support, for example, a printed circuit, the electric connections of the control chip to an external system being formed through the package. As a variation, the control chip, having the optoelectronic chip fixed thereto, may be directly fixed to the support.

FIG. 1 is a partial simplified cross-section view of an embodiment of an optoelectronic device 5 comprising an optoelectronic chip 6 fixed to a control chip 7, optoelectronic chip 6 comprising light-emitting diodes formed from wires such as previously described. As an example, the optoelectronic chip 6 shown in FIG. 1 comprises three groups $G_1$, $G_2$ and $G_3$ of assemblies of light-emitting diodes. Each group contains one or a plurality of assemblies of light-emitting diodes, assembled in series and/or in parallel. Each diode assembly comprises one or a plurality of diodes assembled in series and/or in parallel. Series connection of diodes means that the anode of one diode is connected to the cathode of the other diode. Parallel connection of diodes means that the anodes of the diodes are connected together and that the cathodes of the diodes are connected together. Each assembly of elementary light-emitting diodes is equivalent to a light-emitting diode comprising an anode and a cathode. Series connection of assemblies means that the anode of one assembly is connected to the cathode of the other assembly. Parallel connection of assemblies means that the anodes of the assemblies are connected together and that the cathodes of the assemblies are connected together.

The number of groups of assemblies of light-emitting diodes depends on the targeted application and may vary from 1 to 200.

FIG. 1 shows an optoelectronic chip structure 6 comprising:
- a semiconductor substrate 10 comprising a lower surface 12 and an opposite upper surface 14, upper surface 14 being preferably planar at least at the level of the groups of assemblies of light-emitting diodes;
- groups of assemblies of light-emitting diodes $G_1$, $G_2$, $G_3$, schematically shown, each group $G_1$, $G_2$, $G_3$ comprising two electrodes, also called terminals;
- an insulating layer 26 extending on surface 14 of the substrate;
- an encapsulation layer 34 covering the entire structure and particularly each group $G_1$, $G_2$, $G_3$;
- an additional support 36, also called handle;
- an insulating layer 38 covering lower surface 12;
- for each group $G_1$, $G_2$, $G_3$, at least one TSV $40_1$, $40_2$, $40_3$, two TSVs being shown in FIG. 1, each TSV $40_1$, $40_2$, $40_3$ comprising a conductive portion $42_1$, $42_2$, $42_3$ which is connected to one of the electrodes of group $G_1$, $G_2$, $G_3$, which extends in substrate 10 from upper surface 14 to lower surface 12 and which is insulated from substrate 10 by an insulating layer $44_1$, $44_2$, $44_3$, conductive portion $42_1$, $42_2$, $42_3$ being continued on insulating layer 38 by a conductive pad $46_1$, $46_2$, $46_3$;
- conductive pads $48_1$, $48_2$, $48_3$ in contact with lower surface 12 through openings $50_1$, $50_2$, $50_3$ provided in insulating layer 38; and
- means 52 of electric insulation, for each group $G_1$, $G_2$, $G_3$ of assemblies of light-emitting diodes, of the portion $53_1$, $53_2$, $53_3$ of substrate 10 which extends between surface 12 and surface 14 and surrounding the associated groups of assemblies of light-emitting diodes $G_1$, $G_2$, $G_3$.

Optoelectronic device 5 may further comprise a phosphor layer, not shown, confounded with encapsulation layer 34, or provided between encapsulation layer 34 and handle 36 or provided on handle 36.

Figure 2:
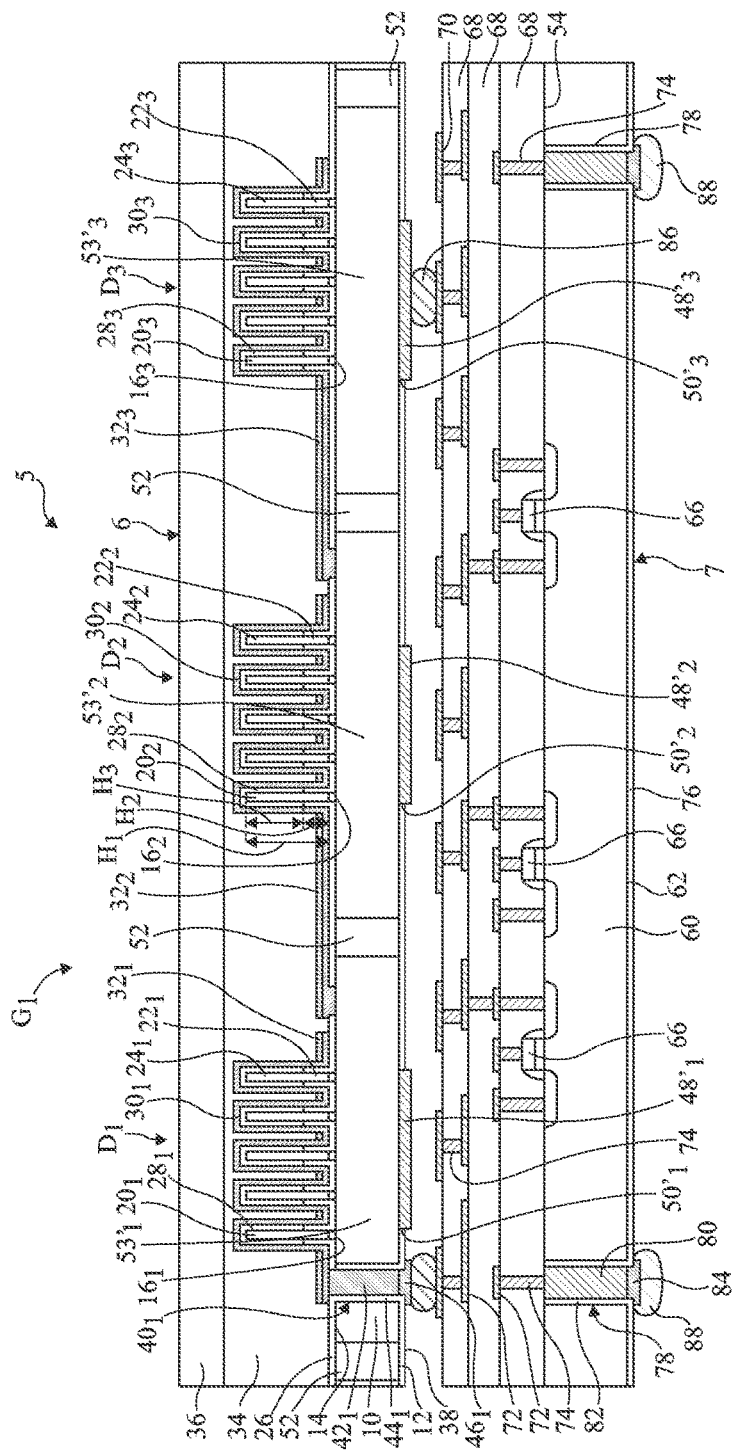
FIG. 2 is a detail view of FIG. 1 of an embodiment of light-emitting diodes comprising microwires or nanowires.

FIG. 2 is a detail view of FIG. 1 of an embodiment of group $G_1$ of assemblies of light-emitting diodes where group $G_1$ comprises three assemblies $D_1$, $D_2$, $D_3$ of elementary light-emitting diodes. The other groups $G_2$ and $G_3$ may have a structure similar to that of group $G_1$. Group $G_1$ comprises:
- seed pads $16_1$, $16_2$, $16_3$ favoring the growth of wires and arranged on surface 14;
- wires $20_1$, $20_2$, $20_3$ distributed in at least two assemblies of wires (three assemblies D1, D2, D3, of five wires being shown as an example in FIG. 2) having a height $H_1$, each wire $20_1$, $20_2$, $20_3$ being in contact with one of seed pads $16_1$, $16_2$, $16_3$, each wire $20_1$, $20_2$, $20_3$ comprising a lower portion $22_1$, $22_2$, $22_3$, of height $H_2$, in contact with seed pad $16_1$, $16_2$, $16_3$ and an upper portion $24_1$, $24_2$, $24_3$, of height $H_3$, continuing lower portion $22_1$, $22_2$, $22_3$, insulating layer 26 extending on the lateral sides of lower portion $22_1$, $22_2$, $22_3$ of each wire $20_1$, $20_2$, $20_3$;
- a shell $28_1$, $28_2$, $28_3$ comprising a stack of semiconductor layers covering each upper portion $24_1$, $24_2$, $24_3$;
- for each assembly $D_1$, $D_2$, $D_3$, a layer $30_1$, $30_2$, $30_3$ forming an electrode covering each shell $28_1$, $28_2$, $28_3$, and connecting them by extending, for this purpose, on insulating layer 26;
- possibly, for each assembly $D_1$, $D_2$, $D_3$, a conductive layer $32_1$, $32_2$, $32_3$ covering electrode layer $30_1$, $30_2$, $30_3$ between wires $20_1$, $20_2$, $20_3$ without extending on wires $20_1$, $20_2$, $20_3$.

Further, in the embodiment shown in FIG. 2, conductive pad $48_1$ distributes into at least one conductive pad $48'_1$, $48'_2$, $48'_3$ per wire assembly, in contact with lower surface 12 through openings $50'_1$, $50'_2$, $50'_3$ provided in insulating layer 38, each conductive pad $48'_1$, $48'_2$, $48'_3$ being substantially arranged vertically in line with wires $20_1$, $20_2$, $20_3$ of each assembly $D_1$, $D_2$, $D_3$.

Further, electric insulation means 52 define, for each assembly $D_1$, $D_2$, $D_3$ of light-emitting diodes, portion $53'_1$, $53'_2$, $53'_3$ of substrate 10 which extends between surfaces 12 and 14 vertically in line with the wires of assembly $D_1$, $D_2$, $D_3$.

Wire $20_1$, $20_2$, $20_3$ and the associated shell $28_1$, $28_2$, $28_3$ form an elementary light-emitting diode. In the embodiment shown in FIG. 2, each assembly $D_1$, $D_2$, $D_3$ thus comprises a plurality of elementary light-emitting diodes connected in parallel. In the present embodiment, the support having the elementary light-emitting diodes resting thereon comprises substrate 10, insulating layer 38, and seed pads $16_1$, $16_2$, $16_3$.

In FIG. 2, light-emitting diode assemblies $D_1$, $D_2$, $D_3$ are shown as being series-connected. To achieve this, electrode $30_1$ of assembly $D_1$ is connected to conductive portion $42_1$ of TSV $40_1$. Electrode $30_2$ of assembly $D_2$ is connected to the substrate portion $53'_1$ associated with assembly $D_1$ and electrode $30_3$ of assembly $D_3$ is connected to the substrate portion $53'_2$ associated with assembly $D_2$.

FIGS. 1 and 2 show a control chip structure 7 comprising:
- a semiconductor substrate 60 comprising a lower surface 62 and an opposite upper surface 64;
- electronic components 66 formed inside and/or on top of substrate 60, three MOS transistors being shown as an example in FIG. 1;
- a stack of insulating layer 68 extending on surface 64 of substrate 60 and on electronic components 66 and comprising an upper surface 69 opposite optoelectronic chip 5;
- conductive pads 70 on the insulating layer at the top of the stack of insulating layers 68;
- interconnection elements, comprising conductive tracks 72 distributed on insulating layers 68 and conductive vias 74 crossing insulating layers 68 and connecting electronic components 66 and conductive pads 70;
- an insulating layer 76 covering lower surface 62;
- possibly, at least one TSV 78 crossing substrate 60 which allows the rear surface connection, TSV 78 comprising a conductive portion 80 which is connected to one of vias 74 and which extends in substrate 60 from upper surface 64 to lower surface 62 and which is insulated from substrate 60 by an insulating layer 82, conductive portion 80 being continued on insulating layer 76 by a conductive pad 84.

In the present embodiment, optoelectronic chip 6 is fixed to control chip 7 by fusible conductive elements 86, for example, solder bumps or indium bumps. Preferably, at least certain solder bumps 86 connect at least some of conductive pads 46$_1$, 46$_2$, 46$_3$, 48$_1$, 48$_2$, 48$_3$ of optoelectronic chip 6 to one of the conductive pads 70 of control chip 7 and provide an electric connection between these conductive pads.

In the more detailed embodiment of group G$_1$ shown in FIG. 2, a single TSV 40$_1$ is associated with the group G$_1$ which is connected to electrode 30$_1$ of assembly D$_1$. The connection between control chip 7 and assembly D$_3$ is formed by conductive pad 48'$_3$, which is connected to control chip 7 by a fusible conductive element 86. As a variation, in the case where two TSVs 40$_1$ are associated with group G$_1$, the second TSV 40$_1$ may be connected to the portion of substrate 53'$_3$ on the side of surface 14.

According to an embodiment, the series and/or parallel connection of the different assemblies of light-emitting diodes D$_1$, D$_2$, D$_3$ may be performed by control chip 7. In this case, each assembly D$_1$, D$_2$, D$_3$ of light-emitting diodes has its two connection terminals connected to control chip 7 by fusible bumps 86, one by a TSV, the other by a conductive pad 48'$_1$, 48'$_2$, 48'$_3$.

According to an embodiment, control chip 7 may be fixed to an external circuit, for example, a printed circuit, not shown, by solder bumps 88, two of which are in contact with conductive pads 84.

In the present embodiment, semiconductor substrate 10 corresponds to a monolithic structure. Semiconductor substrate 10 for example is a substrate made of silicon, of germanium, of silicon carbide, of a III-V compound, such as GaN or GaAs, or a ZnO substrate. Preferably, substrate 10 is a single-crystal silicon substrate.

Preferably, semiconductor substrate 10 is doped to lower the electric resistivity down to a resistivity close to that of metals, preferably smaller than a few mohm·cm. Substrate 10 preferably is a heavily-doped substrate with a dopant concentration in the range from $5*10^{16}$ atoms/cm$^3$ to $2*10^{20}$ atoms/cm$^3$, preferably from $1*10^{19}$ atoms/cm$^3$ to $2*10^{20}$ atoms/cm$^3$, for example $5*10^{19}$ atoms/cm$^3$. Substrate 10 has a thickness in the range from 275 µm to 1,500 µm, preferably 725 µm. In the case of a silicon substrate 10, examples of P-type dopants are boron (B) or indium (In) and examples of N-type dopants are phosphorus (P), arsenic (As), or antimony (Sb). Preferably, substrate 10 is N-type phosphorus-doped. Surface 12 of silicon substrate 10 may be a (100) surface.

Seed pads 16$_1$, 16$_2$, 16$_3$, also called seed islands, are made of a material favoring the growth of wires 20$_1$, 20$_2$, 20$_3$. A treatment may be provided to protect the lateral sides of the seed pads and the surface of the substrate portions which are not covered with the seed pads to prevent the wires from growing on the lateral sides of the seed pads and on the surface of the substrate portions which are not covered with the seed pads. The treatment may comprise forming a dielectric region on the lateral sides of the seed pads and extending on top of and/or inside of the substrate and connecting, for each pair of pads, one of the pads of the pair to the other pad in the pair, with no wire growth on the dielectric region. Said dielectric region may further extend above seed pads 16$_1$, 16$_2$, 16$_3$. As a variation, seed pads 16$_1$, 16$_2$, 16$_3$ may be replaced with a seed layer covering surface 14 of substrate 10 in the area associated with assembly D$_1$, D$_2$ or D$_3$. A dielectric region may then be formed above the seed layer to prevent the growth of wires in unwanted locations.

As an example, the material forming seed pads 16$_1$, 16$_2$, 16$_3$ may be a nitride, a carbide, or a boride of a transition metal from column IV, V, or VI of the periodic table of elements or a combination of these compounds.

Insulating layer 26 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (SiO$_x$N$_y$, where x may be approximately equal to ½ and y may be approximately equal to 1, for example, Si$_2$ON$_2$), of aluminum oxide (Al$_2$O$_3$), of hafnium oxide (HfO$_2$), or of diamond. As an example, the thickness of insulating layer 26 is in the range from 5 nm to 800 nm, for example, equal to approximately 30 nm.

Wires 20$_1$, 20$_2$, 20$_3$ are at least partly formed from at least one semiconductor material. The semiconductor material may be silicon, germanium, silicon carbide, a III-V compound, a II-VI compound, or a combination of these compounds.

Wires 20$_1$, 20$_2$, 20$_3$ may be at least partly formed of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 20$_1$, 20$_2$, 20$_3$ may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 20$_1$, 20$_2$, 20$_3$ may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires 20$_1$, 20$_2$, 20$_3$ may have different shapes, such as, for example, an oval, circular, or polygonal, particularly triangular, rectangular, square, or hexagonal, shape. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section. The average diameter of each wire 20$_1$, 20$_2$, 20$_3$ may be in the range from 50 nm to 2.5 µm. Height H$_1$ of each wire 20$_1$, 20$_2$, 20$_3$ may be in the range from 250 nm to 50 µm. Each wire 20$_1$, 20$_2$, 20$_3$ may have an elongated semiconductor structure along an axis substantially perpendicular to surface 14. Each wire 20$_1$, 20$_2$, 20$_3$ may have a generally cylindrical shape. The axes of two adjacent wires 20 may be distant by from 0.5 µm to 10 µm and preferably from 1.5 µm to 4 µm. As an example, wires 20$_1$, 20$_2$, 20$_3$ may be regularly distributed, particularly in a hexagonal network. The number of wires 20$_1$, 20$_2$, 20$_3$ may vary from one assembly D$_1$, D$_2$ and D$_3$ to the other.

As an example, lower portion 22$_1$, 22$_2$, 22$_3$ of each wire 20$_1$, 20$_2$, 20$_3$ is mainly formed of the III-N compound, for example, gallium nitride, of same doping type as substrate 10, for example, type N, for example, silicon-doped. Lower portion $22_1$, $22_2$, $22_3$ extends up to a height $H_2$ which may be in the range from 100 nm to 25 µm.

As an example, upper portion $24_1$, $24_2$, $24_3$ of each wire $20_1$, $20_2$, $20_3$ is at least partially made of a III-N compound, for example, GaN. Upper portion $24_1$, $24_2$, $24_3$ may be N-type doped, possibly less heavily doped than lower portion $22_1$, $22_2$, $22_3$ or may not be intentionally doped. Upper portion $24_1$, $24_2$, $24_3$ extends up to a height $H_3$ which may be in the range from 100 nm to 25 µm.

Shell $28_1$, $28_2$, $28_3$ may comprise a stack of a plurality of layers, particularly comprising:

an active layer covering upper portion $24_1$, $24_2$, $24_3$ of the associated wire $20_1$, $20_2$, $20_3$;

an intermediate layer having a conductivity type opposite to that of lower portion $22_1$, $22_2$, $22_3$ and covering the active layer; and a connection layer covering the intermediate layer and covered with electrode $30_1$, $30_2$, $30_3$.

The active layer is the layer from which most of the radiation delivered by the elementary light-emitting diode is emitted. According to an example, the active layer may comprise electric charge carrier confinement means, such as multiple quantum wells. It is for example formed of an alternation of GaN and InGaN layers having respective thicknesses from 5 to 20 nm (for example, 8 nm) and from 1 to 10 nm (for example, 2.5 nm). The GaN layers may be doped, for example, of type N or P. According to another example, the active layer may comprise a single InGaN layer, for example having a thickness greater than 10 nm.

The intermediate layer, for example, P-type doped, may correspond to a semiconductor layer or to a stack of semiconductor layers and allows the forming of a P—N or P—I—N junction, the active layer being between the intermediate P-type layer and upper N-type portion $24_1$, $24_2$, $24_3$ of the P—N or P—I—N junction.

The bonding layer may correspond to a semiconductor layer or to a stack of semiconductor layers and enables to form an ohmic contact between the intermediate layer and electrode $30_1$, $30_2$, $30_3$. As an example, the bonding layer may be very heavily doped, of a type opposite to that of lower portion $22_1$, $22_2$, $22_3$ of each wire 20, until the semiconductor layer(s) degenerate, for example, P-type doped at a concentration greater than or equal to $10^{20}$ atoms/cm³.

The stack of semiconductor layers may comprise an electron barrier layer formed of a ternary alloy, for example, aluminum gallium nitride (AlGaN) or aluminum indium nitride (AlInN) in contact with the active layer and the intermediate layer, for a good distribution of electric carriers in the active layer.

Electrode $30_1$, $30_2$, $30_3$ is capable of biasing the active layer of each wire $20_1$, $20_2$, $20_3$ and of letting through the electromagnetic radiation emitted by the light-emitting diodes. The material forming electrode $30_1$, $30_2$, $30_3$ may be a transparent and conductive material such as indium tin oxide (ITO), aluminum or gallium zinc oxide, or graphene. As an example, electrode layer $30_1$, $30_2$, $30_3$ has a thickness in the range from 5 nm to 200 nm, preferably from 20 nm to 50 nm.

Conductive layer $32_1$, $32_2$, $32_3$ preferably corresponds to a metal layer, for example, aluminum, silver, copper, or zinc. As an example, conductive layer $32_1$, $32_2$, $32_3$ has a thickness in the range from 20 nm to 1,000 nm, preferably from 100 nm to 200 nm.

Encapsulation layer 34 is made of an at least partially transparent insulating material. The minimum thickness of encapsulation layer 34 is in the range from 250 nm to 50 µm so that encapsulation layer 34 fully covers electrode $30_1$, $30_2$, $30_3$ at the top of the assemblies of light-emitting diodes $D_1$, $D_2$, $D_3$. Encapsulation layer 34 may be made of an at least partially transparent inorganic material. As an example, the inorganic material is selected from the group comprising silicon oxides, of type $SiO_x$, where x is a real number between 1 and 2, or $SiO_yN_z$ where y and z are real numbers between 0 and 1, and aluminum oxides, for example, $Al_2O_3$. Encapsulation layer 34 may be made of an at least partially transparent organic material. As an example, encapsulation layer 34 is a silicone polymer, an epoxide polymer, an acrylic polymer, or a polycarbonate.

As an example, handle 36 has a thickness in the range from 50 µm to 5,000 µm, preferably from 200 µm to 1,000 µm. Handle 36 is made of an at least partly transparent material. It may be glass, particularly a borosilicate glass, for example, Pyrex, or sapphire. According to another embodiment, handle 36 is not present.

The active layer of shell $28_1$, $28_2$, $28_3$ of the elementary light-emitting diodes of at least one of the assemblies of light-emitting diodes $D_1$, $D_2$, $D_3$ may be manufactured identically or not to the active layer of the shell of the elementary light-emitting diodes of the other assemblies of light-emitting diodes. For example, the active layer of shell $28_1$ may be capable of emitting light at a first wavelength, for example, blue light and the active layer of shell $28_2$ may be capable of emitting light at a second wavelength different from the first wavelength, for example, green light. This may be obtained, for example, by adapting the thicknesses or the compositions of the quantum wells forming these active layers. In the case where the active layers of shells $28_1$, $28_2$ are manufactured in different ways, a first masking step may be provided to protect assembly $D_2$ during the forming of the active layer of shell $28_1$ and a second masking step may be provided to protect assembly $D_1$ during the forming of the active portion of shell $28_2$. Further, assembly $D_3$ may be capable of emitting light at a third wavelength different from the first and second wavelengths, for example, red light. Thus, the composition of the blue, green, and red lights may be selected so that an observer perceives white light by color composition, each diode, or diode assembly, emitting at a first, second, and third wavelength which can be addressed independently from the others to adjust the color.

In the embodiment shown in FIG. 1, each conductive portion $42_1$, $42_2$, $42_3$ may correspond to a layer or to a stack of layers covering insulating layer $44_1$, $44_2$, $44_3$. The core of TSV $40_1$, $40_2$, $40_3$ may be totally or only partially filled with a conductive material.

In the previously-described embodiment, TSVs $40_1$, $40_2$, $40_3$ come into contact with electrode $30_1$, $30_2$, $30_3$ at the periphery of each assembly $D_1$, $D_2$, $D_3$ of light-emitting diodes. According to another embodiment, a TSV may further be provided at the level of each wire $20_1$, $20_2$, $20_3$ of optoelectronic chip 6. Each TSV comes into contact with seed pad $16_1$, $16_2$, $16_3$ of the associated wire. The TSVs may be unconnected to one another. The wires can then be separately biased. As a variation, an electrode provided on the side of rear surface 12 of substrate 10 may be connected to the assembly of the TSVs associated with a same assembly $D_1$, $D_2$, $D_3$ of light-emitting diodes. According to another embodiment, a TSV may simultaneously come into contact with seed pads $16_1$, $16_2$, $16_3$ of a plurality of wires $20_1$, $20_2$, $20_3$ of a same assembly $D_1$, $D_2$, $D_3$ of light-emitting diodes.

According to another embodiment, each TSV $40_1$, $40_2$, $40_3$ may be formed by a filling material, for example, polysilicon, tungsten, or a refractory metallic material which supports the thermal budget during the subsequent steps of the method of manufacturing optoelectronic chip 6. The polysilicon advantageously has a thermal expansion coefficient close to that of silicon and thus enables to decrease the mechanical stress during the subsequent steps carried out at high temperatures of the method of manufacturing optoelectronic chip 6.

According to another embodiment, instead of forming a TSV with a filling material insulated from substrate 10 by insulating walls, the TSV may be formed by insulating trenches delimiting a portion of the substrate which then plays the role of the conductive portion of the TSV. Preferably, heavily-doped silicon, for example, having a dopant concentration greater than or equal to $10^{19}$ atoms/cm$^3$, is then used to decrease the resistance of this connection.

In the present embodiment, electric insulation means 52 comprise trenches extending across the entire thickness of substrate 10 and filled with an insulating material, for example, an oxide, particularly silicon oxide, or an insulating polymer. As a variation, the electric insulation of each substrate portion 10 associated with each diode is provided by TSV $40_1$. According to another variation, electric insulation walls 52 comprise doped regions of a biasing type opposite to substrate 10 and extending along the entire depth of substrate 10.

According to another embodiment, substrate 10 may be absent. A mirror layer may then be arranged on the lower surface of the optoelectronic chip in contact with seed pads $16_1$, $16_2$, $16_3$. According to an embodiment, the mirror layer is capable of at least partly reflecting the radiation emitted by the elementary light-emitting diodes. The mirror layer may be covered with at least one metal layer. Insulating layer 38 then directly covers the mirror layer (or the metal layer if present). Conductive pads $46_1$, $46_2$, $46_3$, $48_1$, $48_2$, $48_3$ are formed on insulating layer 38 as previously described.

In this embodiment, the support having the elementary light-emitting diodes resting thereon comprises the seed pads, the mirror layer, and the conductive pads.

Figure 3:
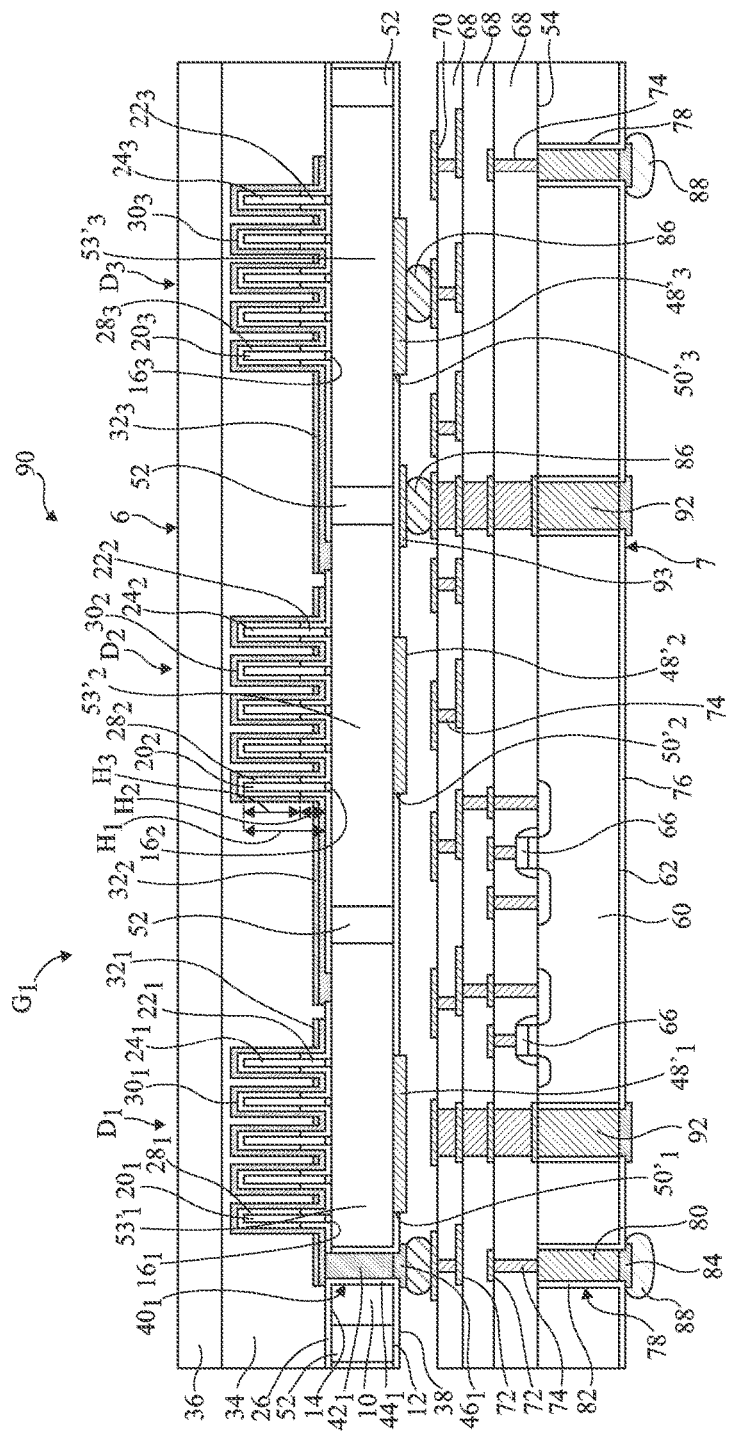
FIG. 3 is a partial simplified cross-section view of another embodiment of an optoelectronic device comprising light-emitting diodes comprising microwires or nanowires.

FIG. 3 shows another embodiment of an optoelectronic device 90 comprising all the elements of optoelectronic device 5 and where control chip 7 further comprises thermal drains 92, two thermal drains 92 being shown as an example in FIG. 3. Thermal drains 92 advantageously enable to improve the removal of the heat generated by optoelectronic chip 6 in operation. Preferably, each thermal drain 92 extends across the entire thickness of control chip 7. Each thermal drain 92 is formed of a stack of materials which are good heat conductors. Preferably, the portion of thermal drain 92 which extends in substrate 60 is electrically insulated from substrate 60 and may have a structure similar to a TSV such as previously described. According to an embodiment, thermal drain 92 may be unconnected to the optoelectronic chip. This is true for the thermal drain 92 shown on the left-hand side of FIG. 3. According to another example, thermal drain 92 may be connected, by a solder bump 86, to a conductive pad 93, as occurs for thermal drain 92 shown on the right-hand side of FIG. 3, arranged on a substrate area of the optoelectronic chip insulated from the electrically-active areas either because it is formed of an area of the substrate totally insulated from the rest of the substrate by trenches filled with electric insulator, or because it is formed of an area of the substrate covered with an electrically-insulating layer.

Figure 4:
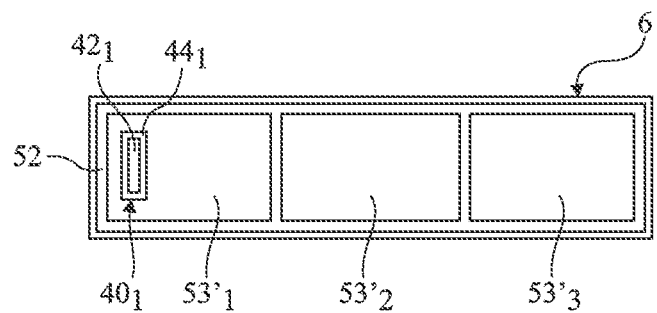
FIG. 4 is a partial simplified cross-section view of the optoelectronic device of FIG. 1.

FIG. 4 is a cross-section view of FIG. 2 along line IV-IV. In this drawing, electric insulation walls 52 are shown as totally surrounding the portion of substrate 10 associated with each assembly of light-emitting diodes $D_1$, $D_2$, $D_3$. However, as a variation, for each pair of assemblies of light-emitting diodes, an electric insulation wall 52 may be provided only between the two adjacent assemblies across the entire width of optoelectronic chip 6. As an example, in the cross-section plane of FIG. 4, each electric insulation wall may have a width in the range from 200 nm to 250 μm and preferably from 5 μm to 30 μm.

In the previously-described embodiment, insulating layer 26 covers the entire periphery of lower portion $22_1$, $22_2$, $22_3$ of each wire $20_1$, $20_2$, $20_3$. As a variation, it is possible for a portion of lower portion $22_1$, $22_2$, $22_3$, or even for the entire lower portion $22_1$, $22_2$, $22_3$, not to be covered with insulating layer 26. In this case, shell $28_1$, $28_2$, $28_3$ may cover each wire 20 up to a height greater than $H_3$, or even up to height $H_1$. Further, in the previously-described embodiment, insulating layer 26 does not cover the periphery of upper portion $24_1$, $24_2$, $24_3$ of each wire $20_1$, $20_2$, $20_3$. As a variation, insulating layer 26 may cover a portion of upper portion $24_1$, $24_2$, $24_3$ of each wire $20_1$, $20_2$, $20_3$. Further, according to another variation, insulating layer 26 may, for each wire $20_1$, $20_2$, $20_3$, partially cover the lower portion of shell $28_1$, $28_2$, $28_3$.

In the embodiments shown in FIGS. 1, 2, and 3, optoelectronic device 5 is electrically connected to an external circuit by solder bumps 88 provided on the lower surface of control chip 7. However, other electric connection modes may be envisaged.

Figure 5:
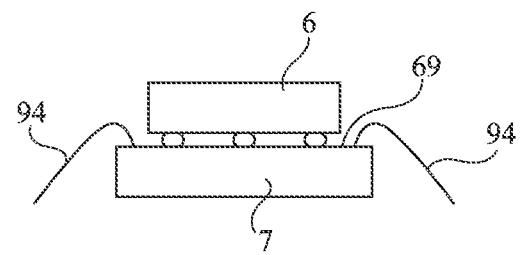
FIGS. 5 to 8 are partial simplified cross-section views of other embodiments of an optoelectronic device comprising light-emitting diodes comprising microwires or nanowires.

FIG. 5 shows another embodiment where control chip 7 is electrically connected to an external circuit, for example, a printed circuit, not shown, by wires 94 which are connected to upper surface 69 of control chip 7 having optoelectronic chip 6 fixed thereto.

Figure 6:
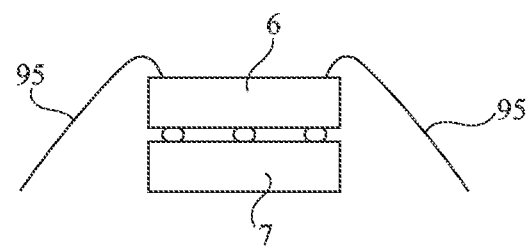

FIG. 6 shows another embodiment where optoelectronic chip 6 is electrically connected to an external circuit, for example, a printed circuit, not shown, by wires 95 which are connected on the upper surface side of optoelectronic chip 6 to conductive pads.

Figure 7:
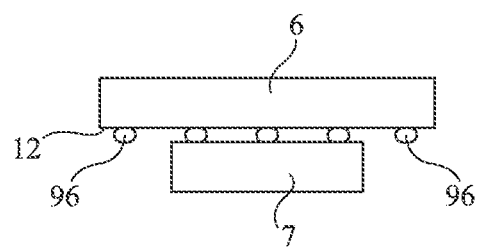

FIG. 7 shows another embodiment where optoelectronic chip 6 is electrically connected to an external circuit, for example, a printed circuit, not shown, by solder bumps 96 which are connected on the side of lower surface 12 of optoelectronic chip 6.

Figure 8:
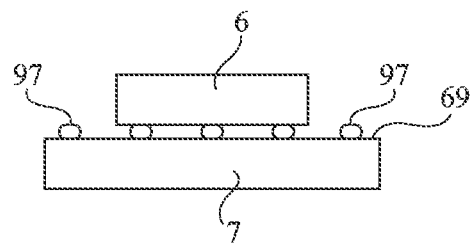

FIG. 8 shows another embodiment where optoelectronic chip 6 is electrically connected to an external circuit, for example, a printed circuit, not shown, by solder bumps 97 which are connected to upper surface 69 of control chip 7.

The embodiments shown in FIGS. 5 to 8 advantageously enable to fix the rear surface of control chip 7 to a thermally conductive support to which thermal drains 92 may be connected. This improves the removal of the heat generated in control chip 7.

According to an embodiment, the method of manufacturing optoelectronic 5 comprises the steps of:
  manufacturing optoelectronic chip 6;
  manufacturing control chip 7;
  assembling optoelectronic chip 6 with control chip 7;
  possibly, arranging the stack of control chip 7 and of optoelectronic chip 6 in a protection package; and
  fixing the stack of control chip 7 and of optoelectronic chip 6 to a support.

An embodiment of a method of manufacturing light-emitting diode assemblies $D_1$, $D_2$, $D_3$ is described in patent applications WO2014/044960 and FR13/59413 which are incorporated herein by reference.

An embodiment of TSVs $42_1$ of the group of light-emitting diodes $G_1$, according to the embodiment shown in FIG. 2, comprises the following steps, where TSVs $42_2$, $42_3$ may be simultaneously formed in the same way:

(1) Etching at least one opening crossing insulating layer 38, substrate 10, insulating layer 26 to expose electrode layer $30_1$. This opening may have a circular or rectangular cross-section. Preferably, electrode layer $30_1$ is also etched to expose a portion of metal layer $32_1$. The etching of substrate 10 may be a deep reactive ion etching (DRIE). The etching of the portion of insulating layer 26 is also performed by plasma etching with the chemistry adapted to insulating layer 26. At the same time, electrode layer $30_1$ may be etched. As a variation, layer $30_1$ may be removed from the areas where TSVs are formed before the step of forming metal layer $32_1$. Trenches for the forming of electric insulation walls 52 may be formed simultaneously to the openings provided for the TSVs.

(2) Forming insulating layer $44_1$ for example, with $SiO_2$ or SiON on layer 38 and on the internal walls of the opening etched at step (1). Insulating layer $44_1$ is for example formed by conformal deposition by PECVD (acronym for Plasma Enhanced Chemical Vapor Deposition) or by conformal deposition of an insulating polymer. Insulating layer $44_1$ has a thickness in the range from 200 nm to 5,000 nm, for example, approximately 3 μm. Insulating layer $44_1$ may be formed at the same time as electric insulation walls 52.

(3) Etching insulating layer $44_1$ to expose conductive layer $32_1$ at the bottom of the opening etched at step (2). It is an anisotropic etching.

(4) Etching at least one opening $50_1$ in insulating layer 38 to expose a portion of surface 12 of substrate 10. To perform this etching, the opening etched at step (1) may be temporarily obstructed, for example, with a resin.

(5) Filling the TSVs and forming conductive pads $46_1$, $48'_1$, $48'_2$, $48'_3$. The TSVs may be filled by electrolytic deposition of copper. The deposition is then planarized with a chemical-mechanical polishing (CMP). Then, a metal deposition may transfer a contact from the pads to surface 12 of substrate 10.

As a variation, TSVs $40_1$ may be formed on the side of upper surface 14 of substrate 10, for example, before the forming of shells $28_1$, $28_2$, $28_3$. TSVs $40_1$ are then only formed across a portion of the thickness of substrate 10 and are exposed on the side of lower surface 12 of substrate 10 after a step of thinning substrate 12. The filling of the TSVs can then be performed by chemical vapor deposition (CVD) and the insulation of the TSVs may be performed by thermal oxidation.

Methods of manufacturing control chip 7 may comprise the conventional steps of an integrated circuit manufacturing method and is not described in further detail.

Methods of assembling optoelectronic chip 6 on control chip 7 may comprise soldering operations. The metal stack forming conductive pads $46_1$, $46_2$, $46_3$, $48_1$, $48_2$, $48_3$, 70 is selected to be compatible with soldering operations used in electronics and in particular with the used solder, for example, made of Cu with an OSP finish (OSP being an acronym for Organic Solderability Preservative) or an Ni—Au finish (by a chemical process, particularly to obtain an ENIG-type structure, ENIG being an acronym for Electroless Nickel Immersion Gold, or by an electrochemical process), Sn, Sn—Ag, Ni—Pd—Au, Sn—Ag—Cu, Ti-Wn-Au, or ENEPIG (acronym for Electroless Nickel/Electroless Palladium/Immersion Gold).

Figure 9:
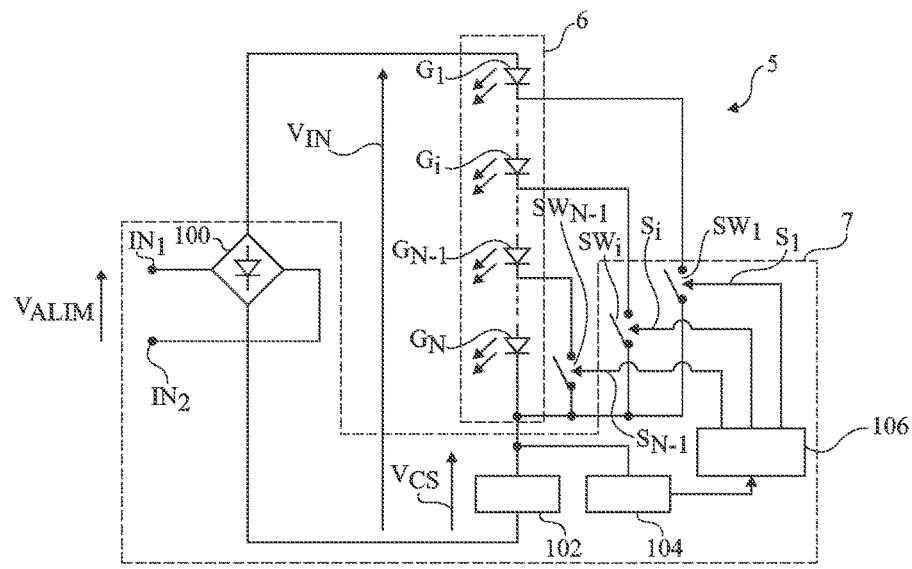
FIGS. 9 and 10 are diagrams of embodiments of the circuit for controlling the optoelectronic device shown in FIG. 1.

FIG. 9 shows an equivalent electric diagram of an embodiment of optoelectronic device 5 where control chip 7 is capable of controlling the groups of light-emitting diodes of optoelectronic chip 6 from an AC power supply voltage. It should however be clear that the electric diagram shown in FIG. 9 is an embodiment only and that the functions carried out by control chip 7 should be adapted according to the provided use of optoelectronic device 5.

In this embodiment, control chip 7 comprises two input terminals $IN_1$ and $IN_2$ intended to receive a power supply voltage $V_{ALIM}$. As an example, input voltage $V_{ALIM}$ may be a sinusoidal voltage having a frequency, for example, in the range from 10 Hz to 1 MHz. Voltage $V_{ALIM}$ for example corresponds to the mains voltage.

Control chip 7 comprises a fullwave rectifying circuit 100 for example comprising a diode bridge for example formed of four diodes. Rectifying circuit 100 receives power supply voltage $V_{ALIM}$ and supplies a voltage $V_{IN}$.

Optoelectronic chip 6 comprises N groups of light-emitting diodes $G_i$, i varying from 1 to N, where N is an integer in the range from 2 to 200, preferably from 2 to 20.

In the present embodiment, the N groups of light-emitting diodes $G_i$, are series-connected. Each group $G_i$ may comprise a plurality of assemblies of light-emitting diodes, for example, series-connected. The series connection may be directly formed at the level of optoelectronic chip 6. As an example, each conductive pad $48_i$ of a group of light-emitting diodes $G_i$ is continued to come into contact with conductive pad $46_{i+1}$ of light-emitting diode group $G_{i+1}$. As a variation, the series connection of the groups of light-emitting diodes may be performed by connection elements located in control chip 7.

Control chip 7 comprises a current source 102 series-connected with light-emitting diode groups $G_1$ to $G_N$. The cathode of the last assembly of light-emitting diodes of group $G_i$ is connected to the anode of the first assembly of light-emitting diodes of group $G_{i+1}$, for i varying from 1 to N−1. Control chip 7 further comprises N−1 controllable switches $SW_1$ to $SW_{N-1}$. Each switch $SW_i$, with i varying from 1 to N−1, is assembled in parallel between the cathode of the last assembly of light-emitting diodes of group $G_i$ and the anode of the first assembly of light-emitting diodes of group $G_{i+1}$. Each switch $SW_i$, with i varying from 1 to N−1, is controlled by a signal $S_i$.

Control chip 7 further comprises a voltage sensor 104 capable of supplying a signal $S_V$ representative of voltage $V_{CS}$ across current source 102. Control chip 7 further comprises a control unit 106 receiving signal $S_V$ and supplying signals $S_1$ to $S_{N-1}$ for ordering the turning off or on of switches $SW_1$ to $SW_{N-1}$. Control unit 106 preferably corresponds to a dedicated circuit.

The operation of optoelectronic device 5 according to the embodiment shown in FIG. 8 is the following, considering that the switches are perfect. Control unit 106 is capable of ordering the turning on or off of switches $SW_i$, with i varying from 1 to N−1, according to the value of voltage $V_{CS}$ across current source 102. To achieve this, control unit 106 is capable of comparing voltage $V_{CS}$ with at least one threshold. As an example, voltage $V_{IN}$ supplied by rectifying bridge 100 is a rectified sinusoidal voltage comprising a succession of cycles having voltage $V_{IN}$ increasing from the zero value, crossing a maximum value, and decreasing to the zero value, in each of them. At the beginning of each cycle, all switches $SW_i$, with i varying from 1 to N−1, are turned on. Thereby, light-emitting diode groups $G_2$ to $G_N$ are shorted and voltage $V_{IN}$ distributes between light-emitting diode group $G_1$ and current source 102. Voltage $V_{IN}$ rises from the zero value. When the voltage across light-emitting diode group $G_1$ exceeds its threshold voltage, light-emitting diode group $G_1$ turns on and starts emitting light. The voltage across light-emitting diode group $G_1$ is then substantially fixed and voltage $V_{CS}$ keeps on increasing along with voltage $V_{IN}$. When voltage $V_{CS}$ exceeds a threshold, unit 106 orders the turning-off of switch $SW_1$. Voltage $V_{IN}$ then distributes between light-emitting diode groups $G_1$ and $G_2$ and current source 102. When the voltage across light-emitting diode group $G_2$ exceeds its threshold voltage, light-emitting diode group $G_2$ turns on and starts emitting light. The voltage across light-emitting diode group $G_2$ is then substantially fixed and voltage $V_{CS}$ keeps on increasing along with voltage $V_{IN}$. When voltage $V_{CS}$ exceeds a threshold, unit 106 orders the turning-off of switch $SW_2$. These steps are repeated until switch $SW_{N-1}$ is off. All the light-emitting diodes are then on. When voltage $V_{IN}$ decreases from its maximum, switches $SW_{N-1}$ to $SW_1$ are successively turned on in this order as voltage $V_{IN}$ decreases, for example, each time voltage $V_{CS}$ decreases below a threshold.

As a variation, when switches $SW_1$ to $SW_{N-1}$ are formed with metal-oxide gate field-effect transistors or MOS transistors, instead of measuring voltage $V_{CS}$, it may be desirable to measure the voltages across the transistors.

Figure 10:
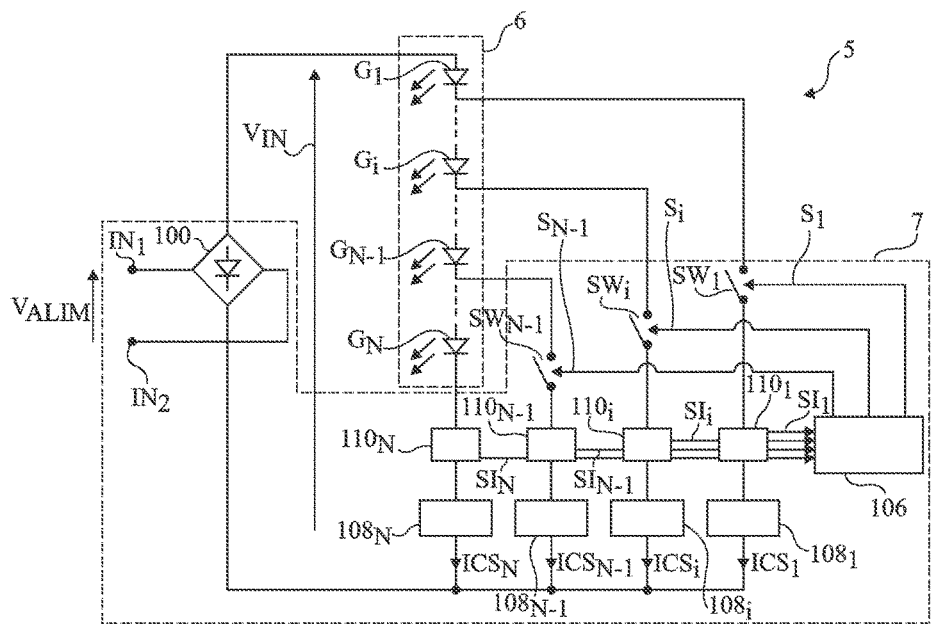

FIG. 10 shows another embodiment of control chip 7. In this embodiment, control chip 7 comprises a controllable current source $108_i$, with i varying from 1 to N, associated with each light-emitting diode group $G_i$. Control unit 106 is capable of independently activating or deactivating each current source $108_i$. Current sources $108_i$, with i varying from 1 to N, have a common terminal. Each current source $108_i$, with i varying from 1 to N, has an associated sensor $110_i$ supplying control unit 106 with a signal $SI_i$ representative of the voltage across current source $108_i$. Current source $108_N$ has a terminal connected to the cathode of the last assembly of light-emitting diodes of group $G_N$. Each current source $108_i$, with i varying from 2 to N, has a terminal connected to the cathode of the last assembly of light-emitting diodes of group $G_i$.

The operation of optoelectronic device 5 according to the embodiment shown in FIG. 9 is the following. Control unit 106 is capable of successively activating each current source $108_i$, with i varying from 1 to N−1, while deactivating the previously-activated current source, according to the voltage across each current source $102_i$, with i varying from 1 to N.

Various embodiments with different variations have been described hereabove. It should be noted that those skilled in the art may combine various elements of these various embodiments and variations without showing any inventive step. As an example, the electric diagram of optoelectronic device 5 shown in FIG. 9 or 10 may be implemented with the structure of device 5 shown in FIG. 2 or of device 90 shown in FIG. 3.

The invention claimed is:

1. An optoelectronic device comprising:
a first integrated circuit comprising a support comprising first and second opposite surfaces, groups of assemblies of light-emitting diodes resting on the first surface, each group comprising at least one assembly of light-emitting diodes connected in parallel and/or in series between first and second terminals, and each assembly of light-emitting diodes comprising a wire, conical or frustoconical semiconductor element or a plurality of wire, conical or frustoconical semiconductor elements connected in parallel, the first integrated circuit further comprising, in the support, first elements of lateral electric insulation of portions of the support around each assembly and, on the second surface, for each group, at least one first conductive pad connected to the first terminal of the group and a second conductive pad connected to the second terminal of the group;
a second integrated circuit comprising third and fourth opposite surfaces, third conductive pads on the third surface electrically connected to the first and second conductive pads, the first integrated circuit being fixed to the third surface of the second integrated circuit;
wherein the support comprises a substrate comprising fifth and sixth opposite surfaces, the light-emitting diodes being located on the side of the fifth surface and comprising, for each assembly, at least one second conductive element insulated from the substrate and crossing the substrate from the fifth surface to the sixth surface and connected to one of the first conductive pads; and
further comprising, for each assembly, an electrode layer covering each light-emitting diode of said assembly and further comprising a conductive layer covering the electrode layer around the light-emitting diodes of said assembly;
wherein the second conductive element is in contact with the conductive layer or the electrode layer.

2. The optoelectronic device of claim 1, wherein the first elements are capable of laterally electrically insulating portions of the substrate underlying the light-emitting diodes of each assembly.

3. The optoelectronic device of claim 2, wherein the first elements comprise insulating walls extending in the substrate from the fifth surface to the sixth surface.

4. The optoelectronic device of claim 1, wherein the second integrated circuit comprises thermal drains crossing the second integrated circuit from the third surface to the fourth surface.

5. The optoelectronic device of claim 1, wherein the second integrated circuit comprises a rectifying circuit intended to receive an AC voltage.

6. The optoelectronic device of claim 1, wherein the first integrated circuit comprises N groups of assemblies of light-emitting diodes, where N is an integer varying from 2 to 200, and wherein the second integrated circuit comprises N−1 switches, each switch being connected to the first terminal or the second terminal of one of said groups.

7. The optoelectronic device of claim 6, wherein the second integrated circuit comprises N current sources, each of N−1 of said current sources being connected to the first or second terminals of one of said groups.

8. The optoelectronic device of claim 1, comprising fourth conductive pads on the fourth surface.

9. The optoelectronic device of claim 1, wherein at least one of the groups comprises at least two assemblies of light-emitting diodes.

* * * * *